United States Patent
Chooi et al.

(10) Patent No.: US 6,265,321 B1
(45) Date of Patent: Jul. 24, 2001

(54) AIR BRIDGE PROCESS FOR FORMING AIR GAPS

(75) Inventors: Simon Chooi; Mei-Sheng Zhou; Yi Xu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/550,264

(22) Filed: Apr. 17, 2000

(51) Int. Cl.$^7$ .................................................. H01L 21/00
(52) U.S. Cl. ........................... 438/725; 438/737; 438/740
(58) Field of Search .................................... 438/626, 631, 438/633, 637, 672, 692, 693, 697, 710, 723, 725, 737, 740; 216/67, 79

(56) References Cited

U.S. PATENT DOCUMENTS

| | | | |
|---|---|---|---|
| 5,324,683 | 6/1994 | Fitch et al. ............................. | 437/65 |
| 5,407,860 | 4/1995 | Stoltz et al. ........................... | 437/180 |
| 5,461,003 | 10/1995 | Havemann et al. .................. | 437/187 |
| 5,510,645 | 4/1996 | Fitch et al. ........................... | 257/522 |
| 5,750,415 | 5/1998 | Gnade et al. ......................... | 437/195 |
| 5,950,102 | 9/1999 | Lee ....................................... | 438/619 |

*Primary Examiner*—William Powell
(74) *Attorney, Agent, or Firm*—George O. Saile; Rosemary L. S. Pike

(57) ABSTRACT

A method for reducing RC delay in integrated circuits by lowering the dielectric constant of the intermetal dielectric material between metal interconnects or metal damascene interconnects is described. The dielectric constant of the intermetal dielectric is lowered by introducing air into the intermetal dielectric between metal interconnections. An air bridge comprising a porous material, preferably amorphous silicon, porous silicon oxide, or porous silsesquioxane, is deposited over a layer containing a reactive organic material. An oxygen plasma treatment or an anisotropic etching through the pores in the air bridge layer removes at least a portion of the reactive material, leaving air plugs within the intermetal dielectric.

37 Claims, 15 Drawing Sheets

AIR BRIDGE PROCESS FOR FORMING AIR GAPS

RELATED PATENT APPLICATION

U.S. patent application Ser. No. 09/550,265 (CS-99-154) to M. S. Zhou et al filed on Apr. 17, 2000.

BACKGROUND OF THE INVENTION (1) Field of the Invention

The invention relates to a method of metallization in the fabrication of integrated circuits, and more particularly, to a method of forming air gaps between metallization in the manufacture of integrated circuits.

(2) Description of the Prior Art

One of the methods of reducing RC delay in aluminum interconnects and copper damascene interconnects is to introduce low dielectric constant materials. In the aluminum interconnects, introduction of such low dielectric constant materials reduces predominantly the intra-metal capacitance. The most ideal candidate for the low dielectric constant material is air. In copper damascene interconnects, the integration concerns of organic low dielectric constant materials (e.g. FLARE) are being intensively addressed. In the meantime, the fabrication of dual and single damascene interconnects is being done using undoped silicon dioxide or doped silicon dioxide (e.g. FSG). One method of further lowering the dielectric constant of the silicon dioxide is to introduce air in the form of air plugs into the dielectric.

U.S. Pat. Nos. 5,324,683 and 5,510,645 to Fitch et al disclose a method of forming air gaps between metal lines by etching away spacers within the space between metal lines and covering the space with a non-conformal material which leaves air gaps where the spacers were. U.S. Pat. No. 5,461,003 to Havemann et al teaches filling gaps between metal lines with a polymer, depositing a porous dielectric layer over the polymer, then removing at least a portion of the polymer through the porous dielectric layer using an oxygen plasma treatment to leave air gaps between the metal lines. Havemann's polymer is a xerogel which may require a long processing time and may not be manufacturable. Control of porosity may not be reliable. U.S. Pat. No. 5,750,415 to Gnade et al teaches a porous silica precursor film over an underlying liquid material between metal lines. The liquid is removed through the porous film by evaporation leaving air gaps between the metal lines. U.S. Pat. No. 5,950,102 to Lee forms interconnects through multiple photoresist layers, then removes all of the photoresist leaving free-standing interconnects surrounded by air. U.S. Pat. No. 5,407,860 to Stoltz et al teaches depositing a spin-on-glass layer over metal lines having sidewall spacers. Air gaps are left between the spacers.

SUMMARY OF THE INVENTION

A principal object of the present invention is to provide an effective and very manufacturable method of metallization in the fabrication of integrated circuit devices.

Another object of the invention is to provide a metallization process using low dielectric constant materials.

Yet another object of the invention is to provide a method for reducing RC delay in integrated circuits by lowering the dielectric constant of the intermetal dielectric material between metal interconnects or metal damascene interconnects.

Yet another object of the invention is to provide an air bridge method of introducing air between metal lines in the fabrication of integrated circuits.

A further object of the invention is to provide an air bridge method to form dummy air plugs between damascene interconnects.

A still further object of the invention is to provide an air bridge method to form dummy air plugs after dual damascene processing.

In accordance with the objects of this invention a method for reducing RC delay in integrated circuits by lowering the dielectric constant of the intermetal dielectric material between metal interconnects or metal damascene interconnects is achieved. The dielectric constant of the intermetal dielectric is lowered by introducing air into the intermetal dielectric between metal interconnections. An air bridge comprising a porous material, preferably amorphous silicon, is deposited over a layer containing a reactive material. An oxygen plasma treatment or an anisotropic etching through the pores in the air bridge layer removes at least a portion of the reactive material, leaving air plugs within the intermetal dielectric.

Also, in accordance with the objects of this invention an air bridge method for introducing air between metal lines in the fabrication of integrated circuits is achieved. A plurality of metal lines is provided over an insulating layer on a semiconductor substrate wherein there is a space between two of the metal lines. A reactive material is deposited over the metal lines and filling the space between the metal lines. A porous material layer is deposited overlying the reactive material. The substrate is exposed to an oxygen plasma wherein the reactive material reacts with the oxygen plasma and is removed from the space between the metal lines through pores in the porous material thereby forming air gaps between metal lines in the fabrication of integrated circuits.

Also, in accordance with the objects of the invention, an air bridge method to form dummy air plugs between damascene interconnects is achieved. A metal line is provided overlying an insulating layer on a semiconductor substrate. A passivation layer is deposited overlying the metal line. A first intermetal dielectric layer is deposited overlying the passivation layer. The first intermetal dielectric layer is patterned to form spaces where planned dummy air plugs will be formed. A reactive material is deposited within the spaces. An air bridge layer is deposited overlying the patterned first intermetal dielectric layer and the reactive material. The substrate is exposed to an oxygen plasma treatment wherein the reactive material reacts with the oxygen plasma and is removed from the spaces in the intermetal dielectric layer through pores in the air bridge layer thereby forming dummy air plugs in the intermetal dielectric layer. Thereafter, a second intermetal dielectric layer is deposited over the air bridge layer. The intermetal dielectric layers are patterned to form a dual damascene opening. The dual damascene opening is filled with a metal layer to complete the dual damascene interconnects in the fabrication of integrated circuits.

Also, in accordance with the objects of the invention, an air bridge method to form dummy air plugs after dual damascene processing is achieved. Dual damascene interconnects are provided within a dielectric layer on a semiconductor substrate wherein the dielectric layer comprises at least an upper layer and a lower layer and wherein a passivation layer overlies the dual damascene interconnects. If the dielectric layer comprises a doped or undoped silicon dioxide material, the passivation layer and the upper layer of the dielectric layer are patterned to leave openings where dummy air plugs are to be formed. A reactive layer is deposited within the openings. An air bridge layer is deposited overlying the patterned passivation layer and the reactive layer. The substrate is exposed to an oxygen plasma treatment wherein the reactive material reacts with the oxygen plasma and is removed from the openings in the dielectric layer through pores in the air bridge layer thereby forming dummy air plugs in the dielectric layer. If the dielectric layer comprises an organic material, an air bridge layer is deposited overlying the passivation layer. A layer is formed overlying the air bridge layer having openings where dummy air plugs are to be formed. The passivation layer not covered by the masking layer is etched through pores in the air bridge layer to extend the pores into and through the passivation layer. The substrate is exposed to an oxygen plasma treatment wherein the organic material dielectric layer reacts with the oxygen plasma and is removed from the openings in the dielectric layer through pores in the passivation layer and in the air bridge layer thereby forming dummy air plugs in the dielectric layer. As an alternative to the oxygen plasma treatment, a portion of the dielectric layer not covered by the masking layer is anisotropically etched through pores in the air bridge and passivation layers thereby forming dummy air pores in the dielectric layer.

BRIEF DESCRIPTION OF THE DRAWINGS

In the accompanying drawings forming a material part of this description, there is shown.

DESCRIPTION OF THE PREFERRED EMBODIMENTS

The present invention proposes a method of introducing air between metal lines or forming dummy air plugs between damascene interconnects by means of an air bridge technique. The method will be described with reference to three embodiments. However, it will be understood by those skilled in the art that the invention should not be limited to the embodiments described herein, but can be extended to any application in which it is desired to form air gaps or plugs in a metallization process or between conducting lines. The first embodiment of the present invention will be described with reference to FIGS. 1 through 5.

Figure 1:
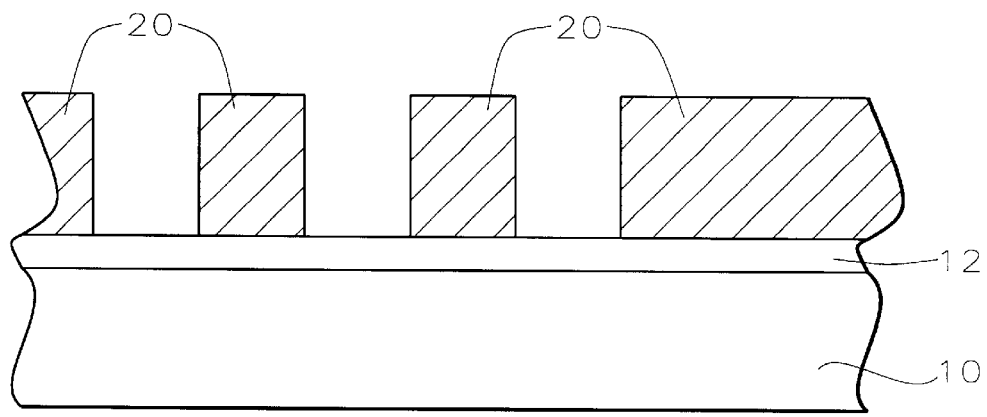
FIGS. 1 through 5 schematically illustrate in cross-sectional representation a first embodiment of the present invention.

Referring now more particularly to FIG. 1, there is illustrated a portion of a partially completed integrated circuit device. There is shown a semiconductor substrate 10, preferably composed of monocrystalline silicon. Semiconductor device structures, such as gate electrodes, source and drain regions, metal interconnects, contact holes, and vias, not shown, may be formed in and on the semiconductor substrate and covered with an insulating layer 12, such as silicon dioxide. Interconnection lines 20, comprising one or more of the following conductors: aluminum-silicon-copper, titanium, titanium nitride, titanium tungsten, and tungsten, are formed over the insulating layer and will contact some of the underlying semiconductor device structures through openings in the insulating layer, not shown.

Figure 2:
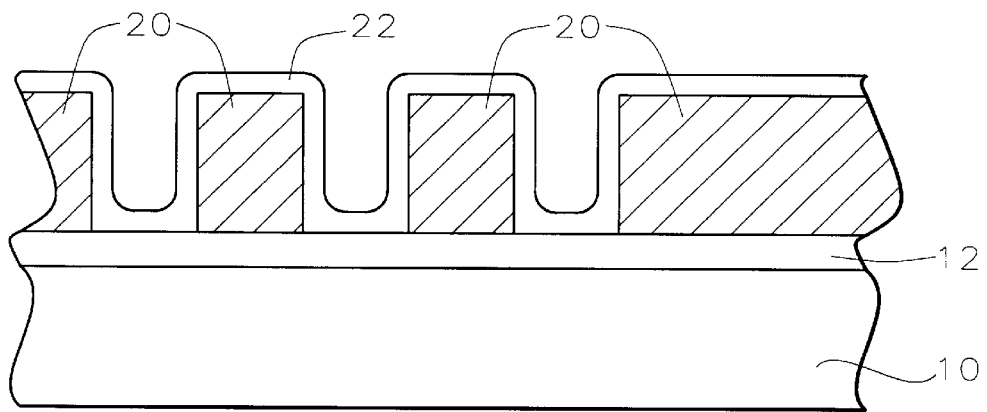

Now, an optional liner layer 22, comprising silicon dioxide or other dielectric material or an organic polymer, may be formed over the metal lines 20 to a thickness of between about 50 and 5000 Angstroms, as shown in FIG. 2. The liner may be deposited through chemical vapor deposition or spin coating. The main function of the liner is to prevent corrosion of the metal interconnects in the event that moisture is trapped in the reactive organic material 26, to be deposited subsequently, and that the moisture is formed during the oxidation of the organic material between the conducting lines. The liner may also help to promote the adhesion of organic material.

Figure 3:
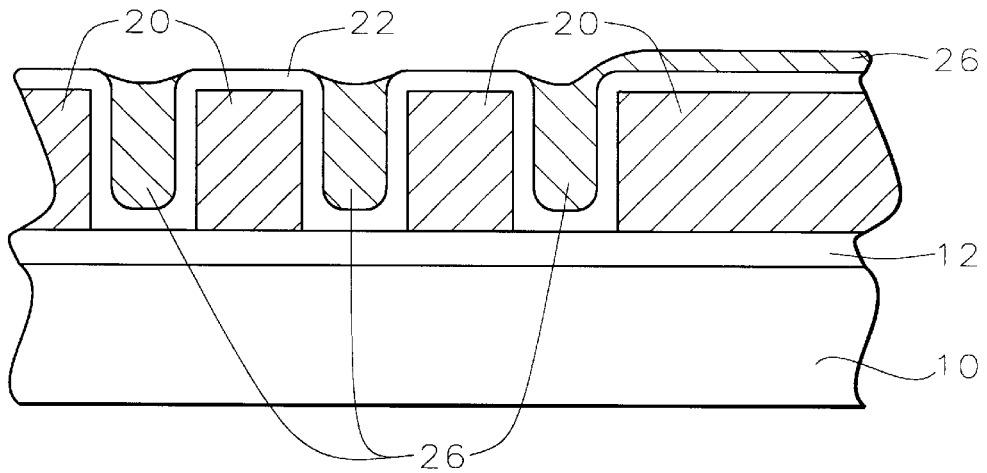

Referring to FIG. 3, a porous or non-porous reactive material 26 is deposited over the metal lines and optional liner layer through spin-coating, a sol-gel method, or chemical vapor deposition (CVD). In general, the reactive material 26 may be any organic material containing carbon and one of the following elements: H, N, F, Cl, S, P, Br, I, and O. Poly(arylsulfonates), Teflon, and photoresist may be used. Also, buckminsterfullerene is disclosed in co-pending U.S. patent application Ser. No. 09/550,265 (CS-99-154). The organic reactive material may then be subjected to an optional film densification treatment ("curing") in a furnace or a rapid thermal anneal (RTA) equipment at a temperature of between about 300 and 500° C. and pressure of between about 450 and 770 Torr. The top of the organic dielectric, particularly over the large metal features, can optionally be removed by using an etching back or chemical mechanical polishing (CMP) process; preferably etching back. The etching chemistry for the etching back can comprise one or more of the following gases: oxygen, nitrogen, hydrogen, forming gas, fluorine, chlorine, $BCl_3$, and argon.

Figure 4:
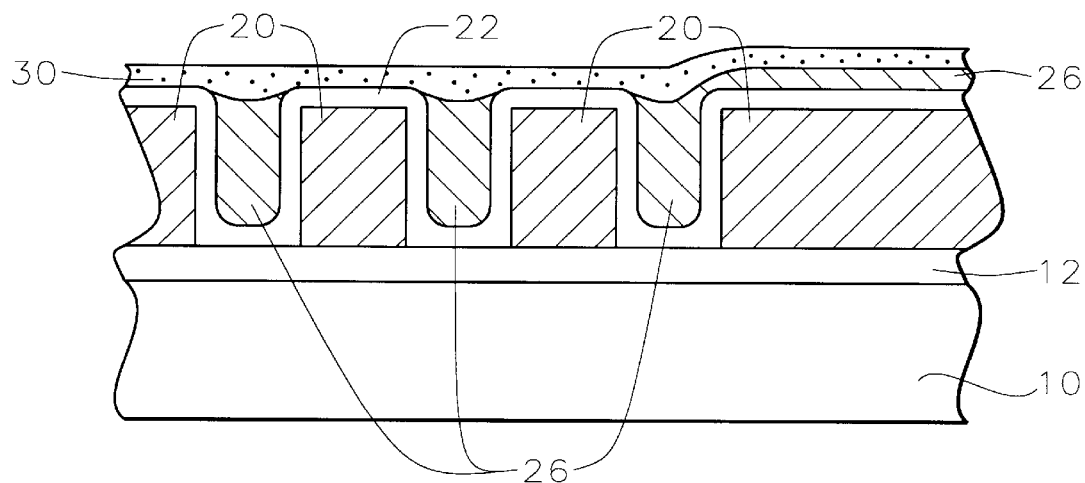

Now, an air bridge is to be formed. This is a thin layer of film that contains pores for gases, liquids, or plasma species to penetrate into the underlying material. This is the first step toward introducing air between the metal lines. Referring to FIG. 4, a thin layer of porous material 30 is deposited over the reactive material 26. The porous material is preferably a silicon material containing pores deposited to a thickness of less than about 2000 Angstroms and preferably between about 50 and 1900 Angstroms. The porous material may be amorphous silicon or other silicon-containing material such as porous hydrogen silsesquioxane, porous methylsilsesquioxane (the latter two deposited by spin-coating), or porous silicon oxide. Preferably, amorphous silicon 30 is deposited at a temperature of between about 250 and 500° C. in a rapid thermal chemical vapor deposition (RTCVD) or furnace using silane as one of the precursors. After deposition, the air bridge material 30 may be subjected to an optional film densification treatment ("curing") in a furnace or a rapid thermal anneal (RTA) equipment at a temperature of between about 300 and 500° C. and pressure of between about 450 and 765 Torr.

Now, the wafer is exposed to an oxygen plasma treatment. The oxygen species generated in the plasma enters into the reactive organic material 26 through pores in the porous film 30. The oxygen species react with the reactive material through oxidation, thereby removing at least a portion of the reactive material through the pores in the porous film and into the ambient. Where the reactive material contains carbon and hydrogen, oxidation will cause formation of gaseous carbon dioxide, carbon monoxide, and water.

Figure 5:
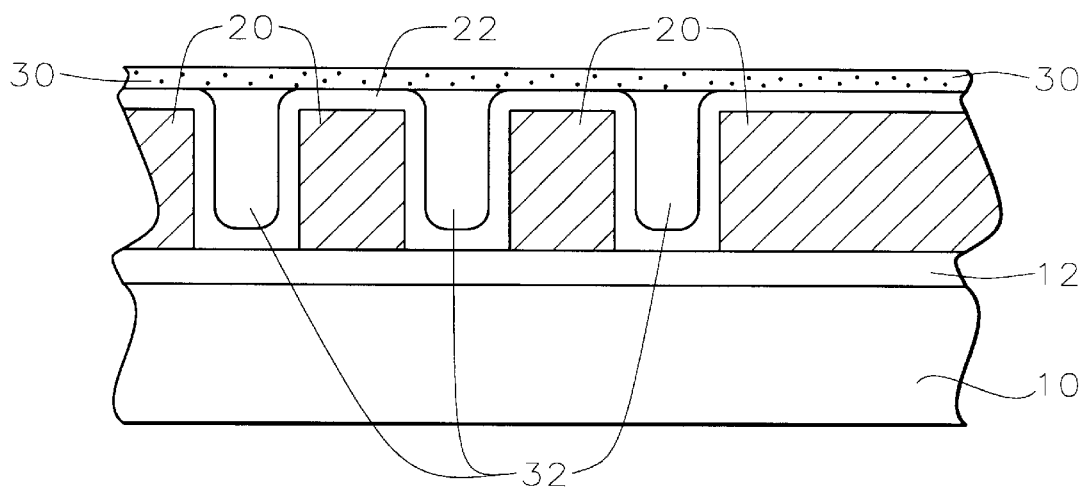

Alternatively, ozone can be used in place of the oxygen and the oxidation can be performed with or without a plasma. For example, the oxygen plasma treatment may be performed at a temperature of between about 40 and 400° C. at a pressure of 0.1 to 30 Torr using oxygen with forming gas (nitrogen with about 4 volume percent of hydrogen) added to aid in the disassociation of oxygen. An oxygen flow rate of 100 to 30,000 sccm is preferred. A power of between 100 and 2000 Watts can be used if RF or microwave is capacitively coupled to the plasma. Preferably, all of the material 26 is removed through the pores in the reactive material 30. After the oxygen plasma treatment, air gaps 32 are left between the metal lines 20, as shown in FIG. 5. This figure shows that the excess organic material 26 over the large metal feature 20 on the right side of the figure has been removed by the optional etching back or CMP step described hereinabove before the deposition of the air bridge material 30.

This completes the formation of a low dielectric constant material; i.e. air 32, between metal lines. Processing continues as is conventional in the art to complete the integrated circuit device. For the present art to be practiced, it may be necessary to place "dummy" metal structures (e.g. lines or round blocks or square blocks) in the open spaces (>1 μm) such that the space between any two metal features is not more than 1 micron.

Figure 6A:
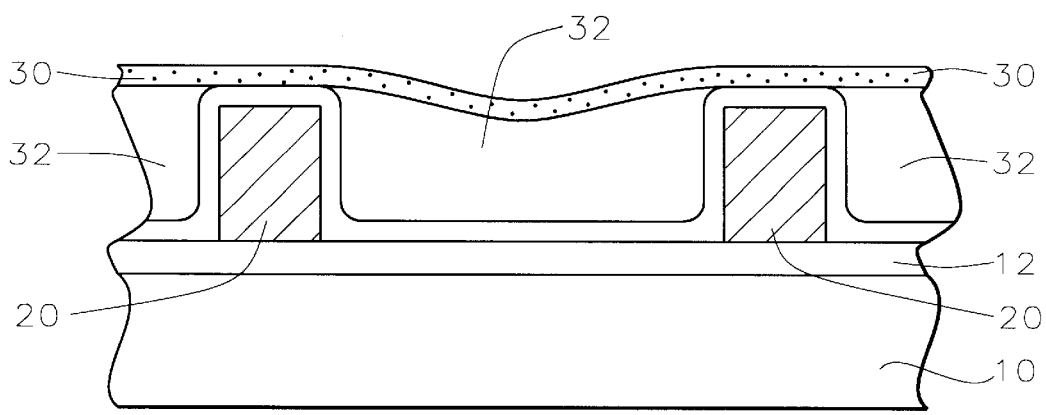
FIGS. 6A through 6C schematically illustrate in cross-sectional representation a problem and solution for wide spaces between metal lines in the process of the present invention.
Figure 6B:
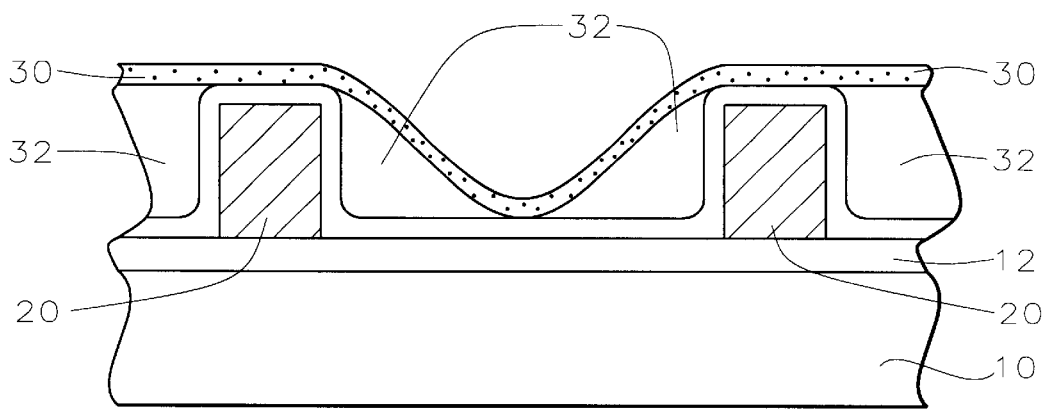
Figure 6C:
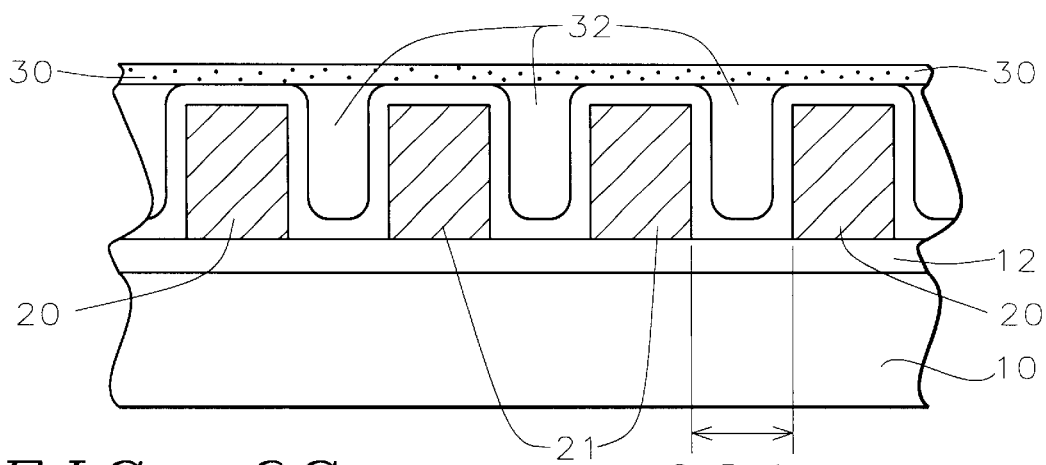

For example, FIG. 6A illustrates metal lines 20 having a wide space therebetween. The air bridge 30 is suspended above a wide air space 32 between the metal lines. The air bridge 30 may collapse, as shown in FIG. 6B. FIG. 6C shows dummy metal lines 21 formed in the wide space between the two metal lines 20 so that the space between any two metal lines is no more than between about 0.5 to 1 μm. This will prevent the collapse of the air bridge. It will be understood by those skilled in the art that the above example applies to any other metal feature other than metal lines (e.g. metal bond pads) that should be separated from another metal feature by no more than between 0.5 μm to 1 μm.

Figure 7:
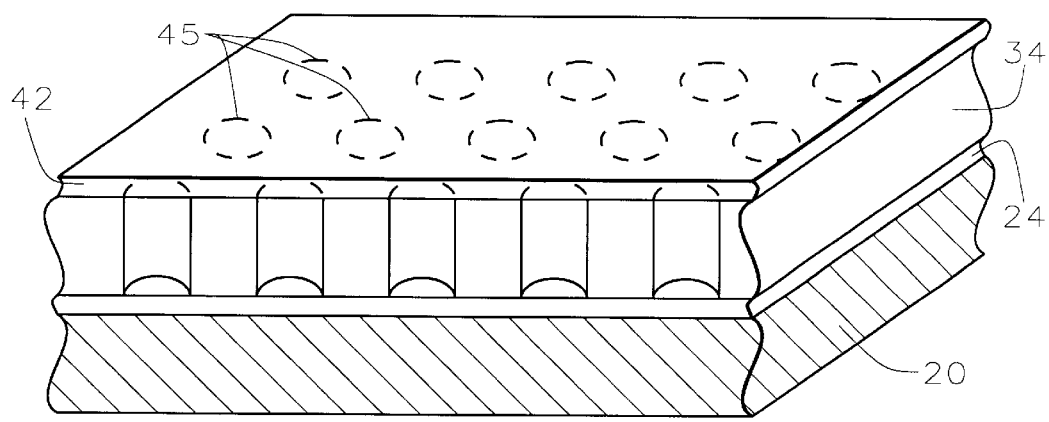
FIG. 7 isometrically illustrates a second embodiment of the present invention.

The second embodiment of the invention will be described with reference to FIGS. 7 through 17. Dummy air plugs will be formed in areas where the trench and via of dual damascene interconnects are absent. The formation of air plugs is achieved through the air bridge layer which is a thin film that incorporates pores for gases, liquids, or plasma species to penetrate into the underlying material. The reaction of these substances with the underlying material generates products which leave through the pores, thus producing air gaps/plugs. FIG. 7 illustrates an isometric view of the dummy air plugs of the invention. Dummy air plugs 45 are formed through the intermetal dielectric layer 34 over passivation layer 24 and copper layer 20. The air bridge layer 42 is shown. Dummy air plugs are beneath the air bridge layer. The formation of the dummy air plugs shown will be described with reference to FIGS. 8 through 17.

Figure 8:
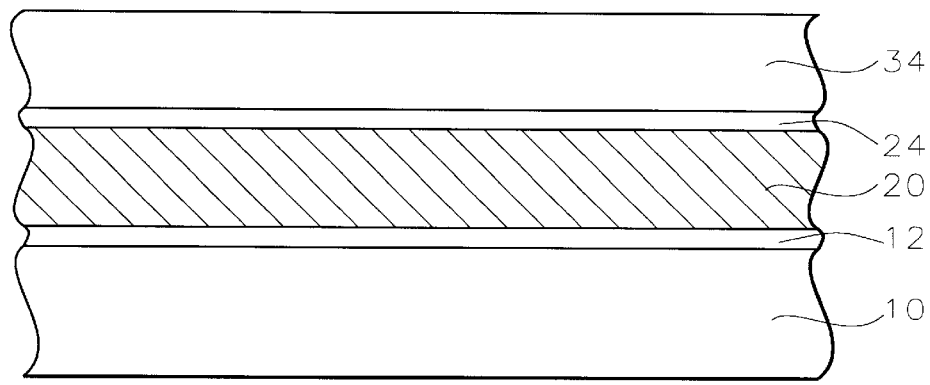
FIGS. 8 through 17 schematically illustrate in cross-sectional representation a second embodiment of the present invention.

Referring now more particularly to FIG. 8, there is shown a partially completed integrated circuit device. There is shown a semiconductor substrate 10, preferably composed of monocrystalline silicon. Semiconductor devices structures, such as gate electrodes, source and drain regions, metal interconnects, contact holes, and vias, not shown, may be formed in and on the semiconductor substrate and covered with an insulating or passivation layer 12, composed of silicon dioxide or silicon nitride. Interconnection lines 20 are formed over the insulating layer and will contact some of the underlying semiconductor device structures through openings in the insulating layer, not shown. The interconnection lines may be composed of copper and barrier metal (e.g. tantalum, tantalum nitride) or a multilayer stack comprising one of more of the following: aluminum-copper, tungsten, titanium, titanium nitride, and titanium tungsten. In the case of copper, the interconnection lines may be part of a dual damascene interconnect, not shown.

A passivation layer, such as silicon nitride or BLOK (from Applied Materials) 24 is deposited over the copper with barrier metal line to a thickness of between about 50 and 5000 Angstroms. Then a first intermetal dielectric layer (IMD1) 34 is deposited over the passivation layer to a thickness of between about 2000 and 10,000 Angstroms. The IMD1 layer may be silicon dioxide or doped silicon dioxide (e.g. fluorosilicate glass or FSG, PSG, BSG, or BPSG) deposited through CVD. The IMD1 layer may also be comprised of hydrogen silsesquioxane or undoped silicate or doped silicates (e.g. doped with phosphorus, boron, or fluorine) deposited through spin-coating.

Figure 9:
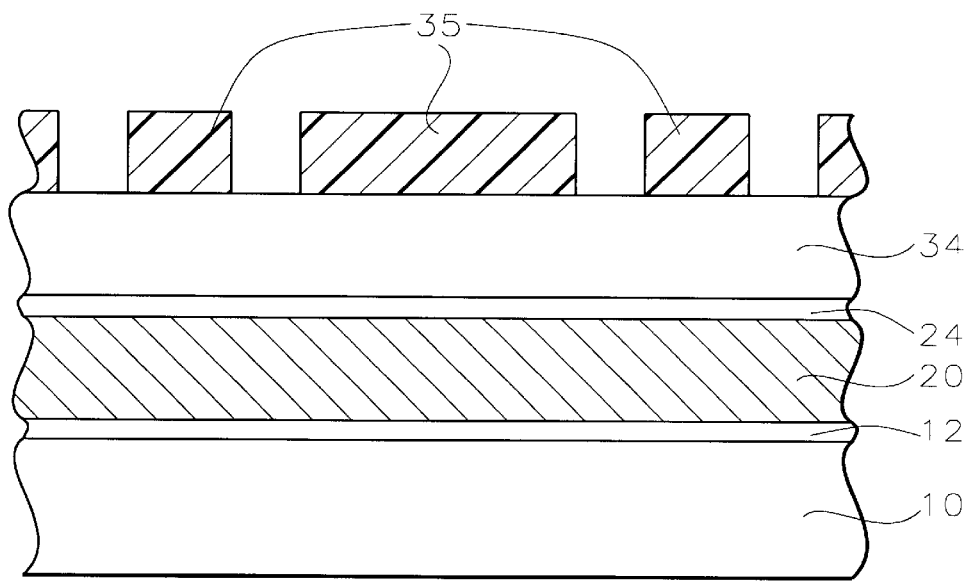

Now, referring to FIG. 9, dummy air gaps are patterned to have a width of less than or equal to about 0.5 microns. For example, a photoresist mask 35 is formed over the IMD1 layer with openings for dummy air plugs in areas where damascene vias or trenches or both vias and trenches will be absent.

Figure 10:
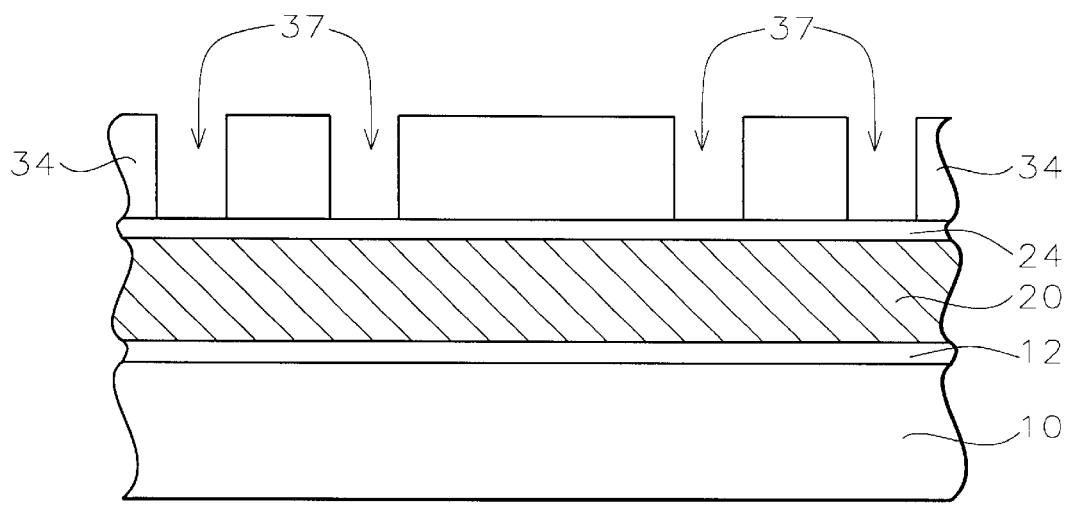

The IMD1 layer is etched through where it is not covered by the photoresist mask 35, leaving spaces 37, as shown in FIG. 10. The photoresist mask is stripped and the wafer is cleaned, as is conventional.

Figure 11:
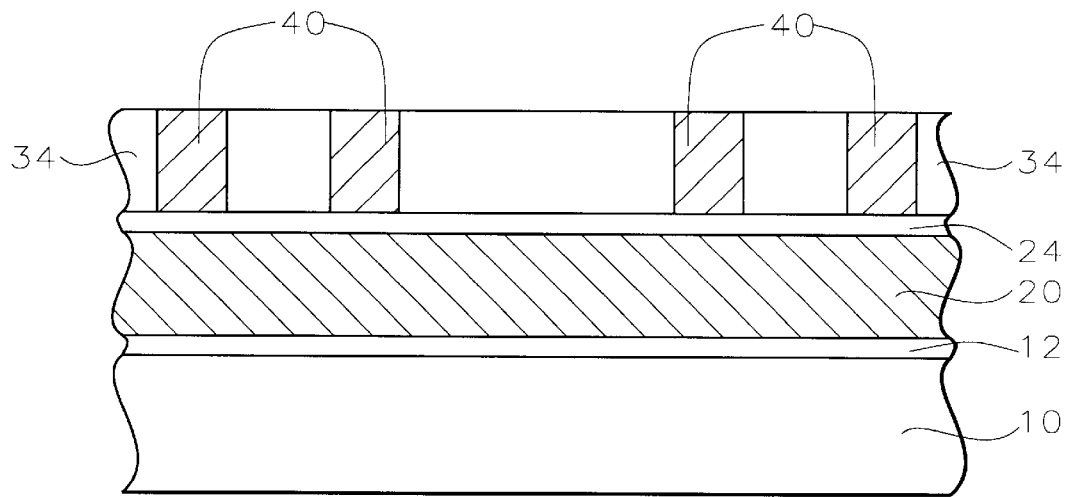

Next, a porous or non-porous organic material 40 is deposited within the spaces 37, as shown in FIG. 11. The organic material can comprise wholly carbon or a combination of carbon and one or more of the following elements: hydrogen, nitrogen, fluorine, chlorine, sulfur, P, Br, I, and oxygen. Optionally, a liner layer, such as silicon oxide, not shown, may be deposited through CVD or spin-coating underlying the organic material 40. The liner layer functions as an adhesion promoter. The organic material may be photoresist, polyimide, poly(arlene)ether (e.g. FLARE from Allied Signal), Teflon, or others. Reflow of the organic material into the spaces may occur during the hot plate baking after spin-coating at temperature between about 50 and 300° C. The organic material may then be subjected to an optional film densification treatment ("curing") in a furnace or RTA equipment at a temperature of between about 300 and 500° C. and pressure of between about 450 and 770 Torr. The top of the organic material is optionally planarized by CMP or etching back, but preferably by etching back. The etching chemistry of the etching back comprises one or more of the following gases: nitrogen, hydrogen, forming gas (nitrogen and hydrogen), argon, fluorine, chlorine, boron trichloride, and oxygen.

Figure 12:
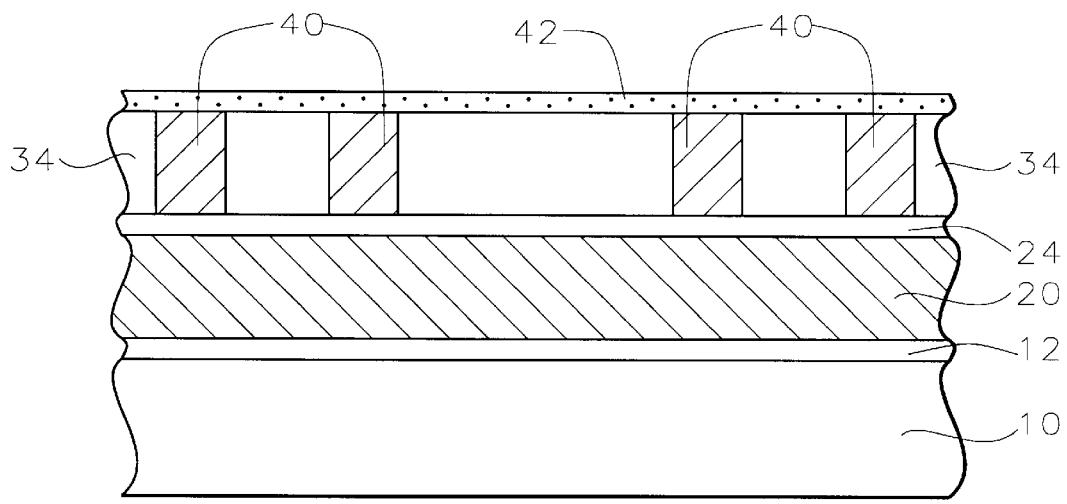

Now the air bridge is to be formed. Referring to FIG. 12, a thin layer of porous material 42 is deposited over the IMD1 34. The porous material is preferably a silicon material containing pores, such as amorphous silicon, porous silicon oxide, porous hydrogen silsesquioxane, porous alkyl silsesquioxane, porous aryl silsesquioxane, or other porous material known in the art. The porous material is deposited to a thickness of less than about 2000 Angstroms and preferably between about 50 and 1900 Angstroms.

Figure 13:
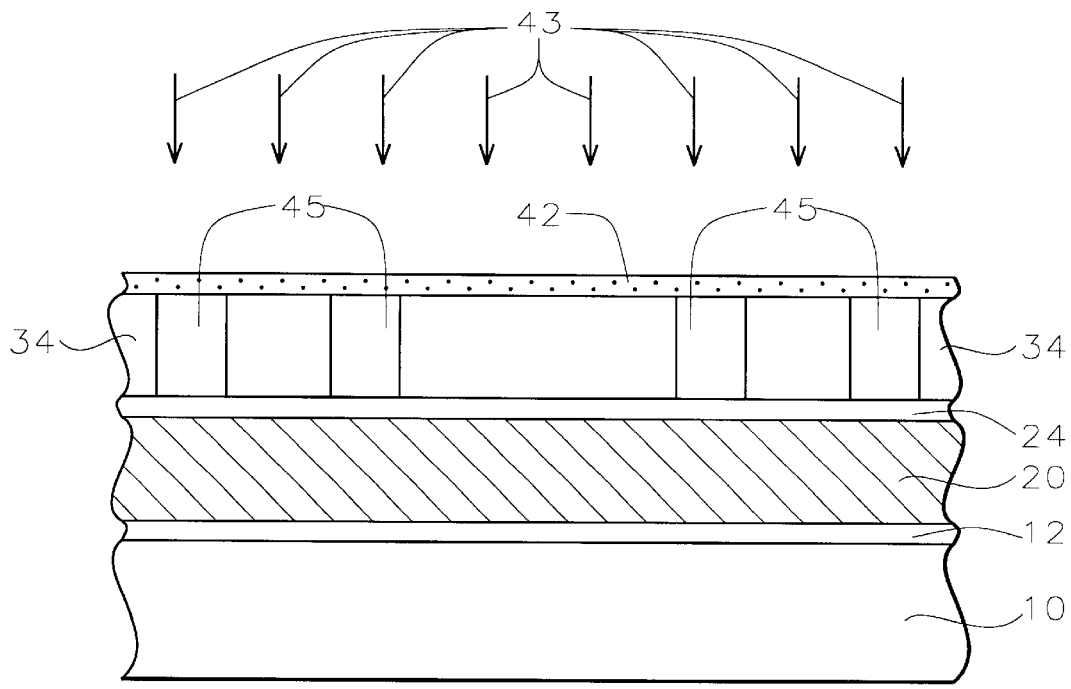

Now, the wafer is exposed to an oxygen plasma treatment 43. The oxygen species (e.g. radicals, ions) from the plasma enters into the reactive material 40 through pores in the porous film 42. The oxygen species oxidizes the reactive material to form gaseous carbon dioxide and carbon monoxide among the products, thereby removing the reactive material 40 through the pores in the porous film and into the ambient, leaving air plugs 45, as shown in FIG. 13. Alternatively, ozone gas can be used in place of oxygen and the oxidation of the reactive material can be carried out with or without a plasma.

Figure 14:
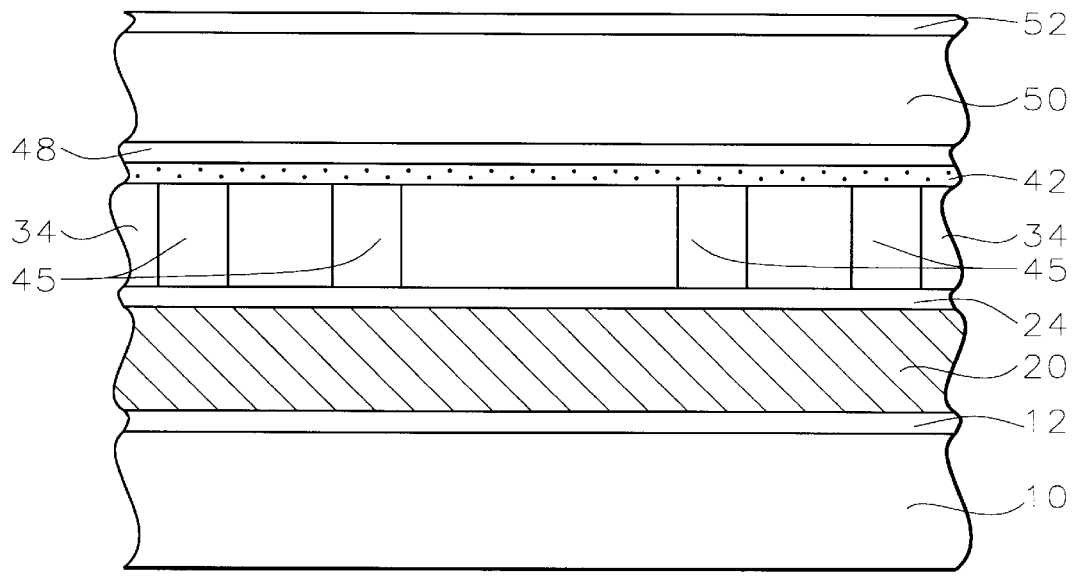

Now, processing continues. As shown in FIG. 14, an optional etch stop layer 48 is deposited to a thickness of between about 50 and 5000 Angstroms followed by a second intermetal dielectric layer IMD2 50 having a thickness of between about 2000 and 10,000 Angstroms. An optional capping layer 52 can be deposited over the IMD2 layer to a thickness of between about 50 and 5000 Angstroms.

Figure 15:
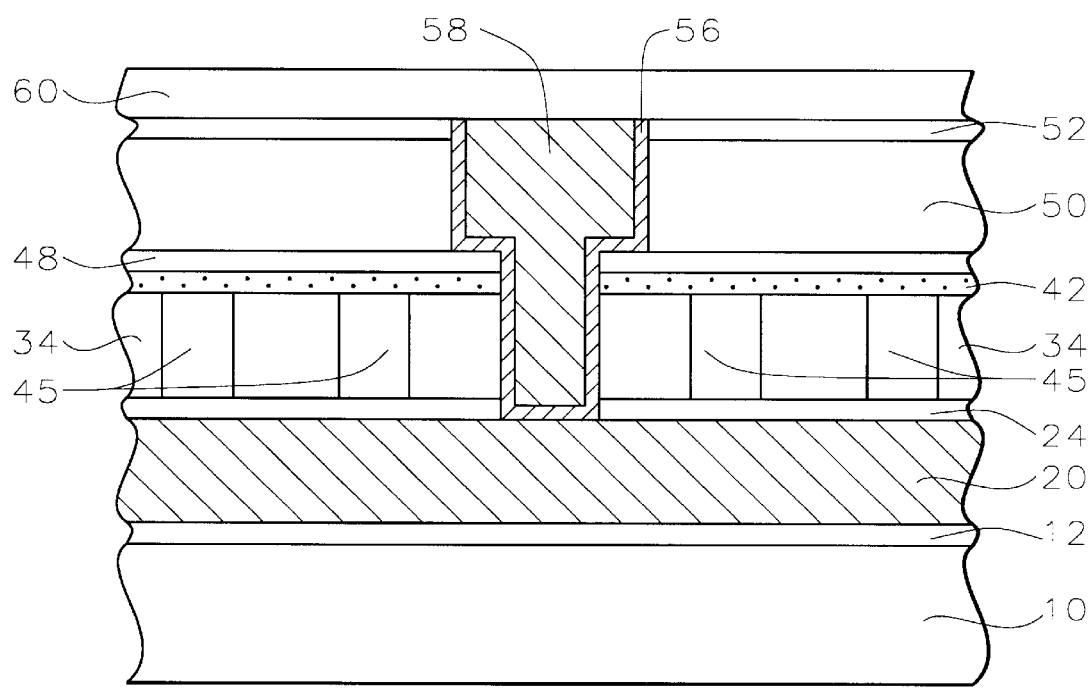

Now, a dual damascene opening is etched through the optional capping layer, the IMD1 and IMD2 layers, the optional etch stop layer, the air bridge layer, and the passivation layer, using one of the various schemes such as trench-first, via-first, or embedded via, as shown in FIG. 15. The dual damascene opening is then wet or dry cleaned to remove etch residue and sputtered conductor on the sidewalls of the trench and via and filled with a barrier metal layer 56 and a copper layer 58 by any of the conventional means, including physical or chemical vapor deposition and etchback or polishing, electroplating, or electroless plating, and so on. A final passivation layer 60 completes the metallization process.

Figure 16:
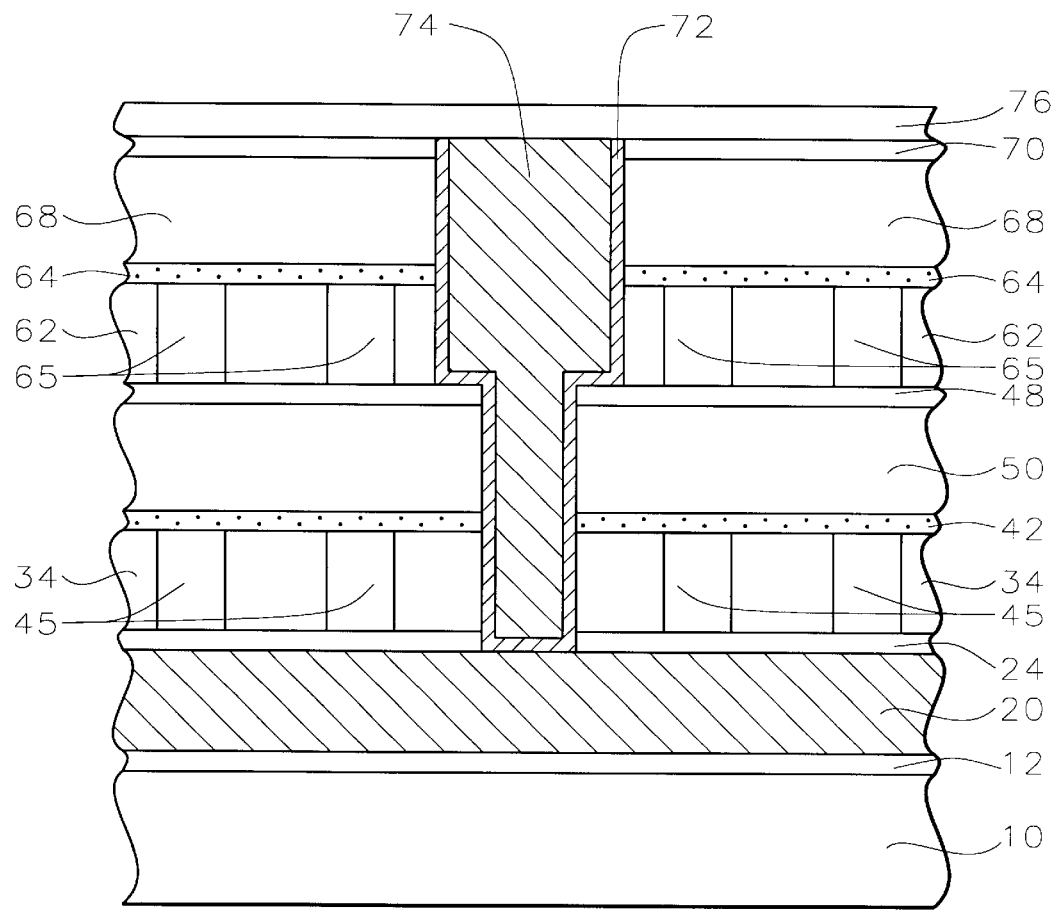

In an alternative process, the creation of air plugs may be repeated on either side of the etch stop layer. As shown in FIG. 16, IMD2 50 is formed over the air bridge 42 and the etch stop layer 48 is deposited over the IMD2 50. Then, IMD3 62 is deposited over the etch stop layer. A second air bridge layer 64 is deposited over the IMD3 layer. Dummy air plugs 65 are formed in the IMD3 layer in the same manner as described for first dummy air plugs 45. Then, IMD4 layer 68 is deposited over the air bridge 64 and the optional capping layer 70 is deposited over IMD4 68. Then the dual damascene opening is patterned and filled with copper 74 with underlying barrier layer 72 and passivation layer 76, as shown.

Figure 17:
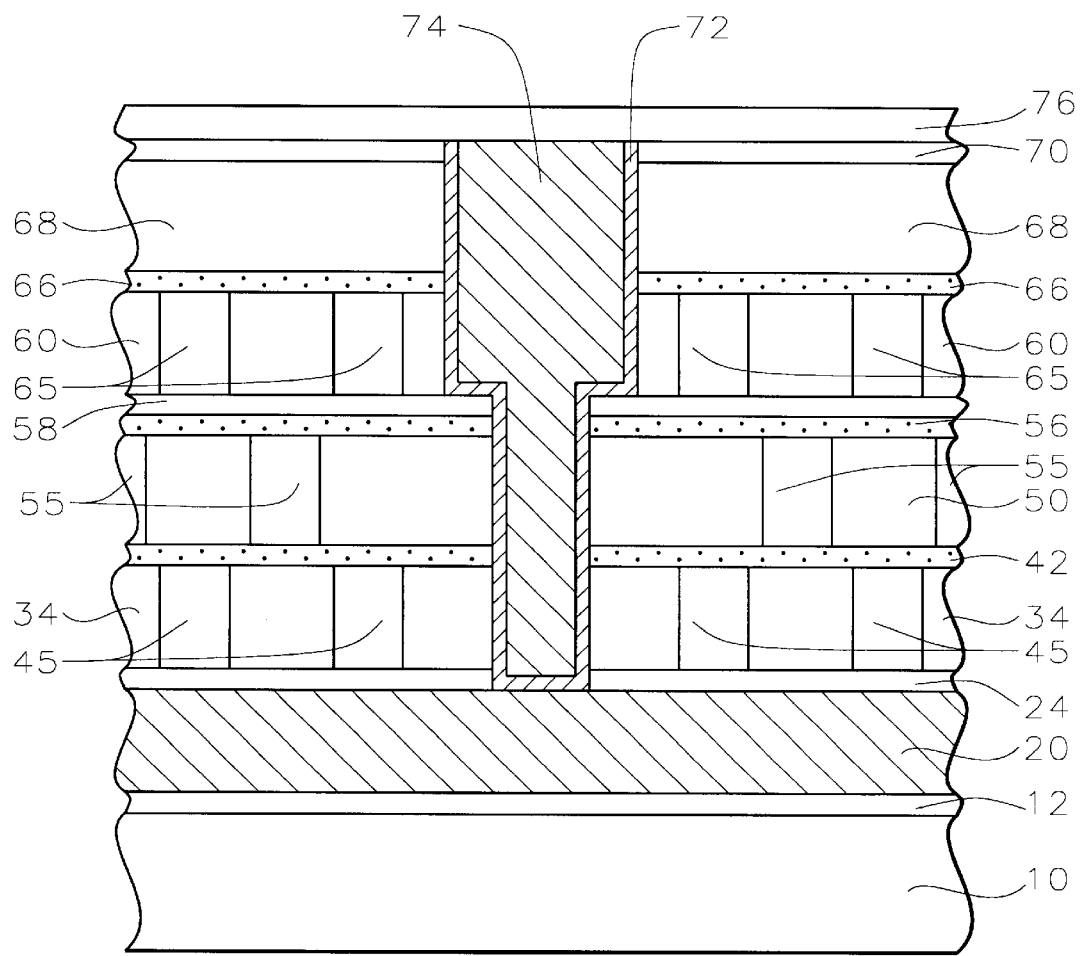

In a second alternative process, dummy air plugs may be created at the IMD1, IMD2, and IMD3 layers, alternating the pattern of air gaps so as to ensure the integrity of the dielectric material. As shown in FIG. 17, IMD2 50 is formed over the air bridge 42. A second air bridge 56 is formed over the IMD2 50. Dummy air plugs 55 are formed in the IMD2 layer in the same manner as described for first dummy air plugs 45. These dummy air plugs alternate with the dummy air plugs in IMD1 and IMD3. Etch stop layer 58 is deposited over the air bridge 56. Then, IMD3 layer 60 is deposited over the etch stop layer and a third air bridge 66 is deposited over IMD3. Dummy air plugs 65 are formed in IMD3, aligned with the air plugs 45 in IMD1. IMD4 68 and the optional capping layer 70 are deposited over the air bridge 66. Then the dual damascene opening is patterned and filled with copper 74 with underlying barrier layer 72 and passivation layer 76, as shown.

The process of the invention reduces the dielectric constant of the dielectric layer in the dual damascene process, especially if the layer comprises doped or undoped silicon dioxide. The design of the dummy air plugs ensures sufficient margin for the trench and via to be etched without touching the air plugs. The design of the dummy air plugs ensures that the dielectric material will not "cave-in" during subsequent chemical mechanical polishing (CMP).

The third embodiment of the invention will be described with reference to FIGS. 18 through 26. Dummy air plugs will be formed after dual damascene processing in areas where the trench and via of dual damascene interconnects are absent. The formation of air plugs is achieved through the air bridge layer which is a thin film that incorporates pores for gases, liquids, or plasma species to penetrate into the underlying material. The reaction of these substances with the underlying material generates products which leave through the pores, thus producing air gaps/plugs. Two alternatives of this embodiment will be described. In the first alternative, the IMD layers comprise doped or undoped silicon dioxide. In the second alternative, the IMD layers comprise an organic material.

Figure 18:
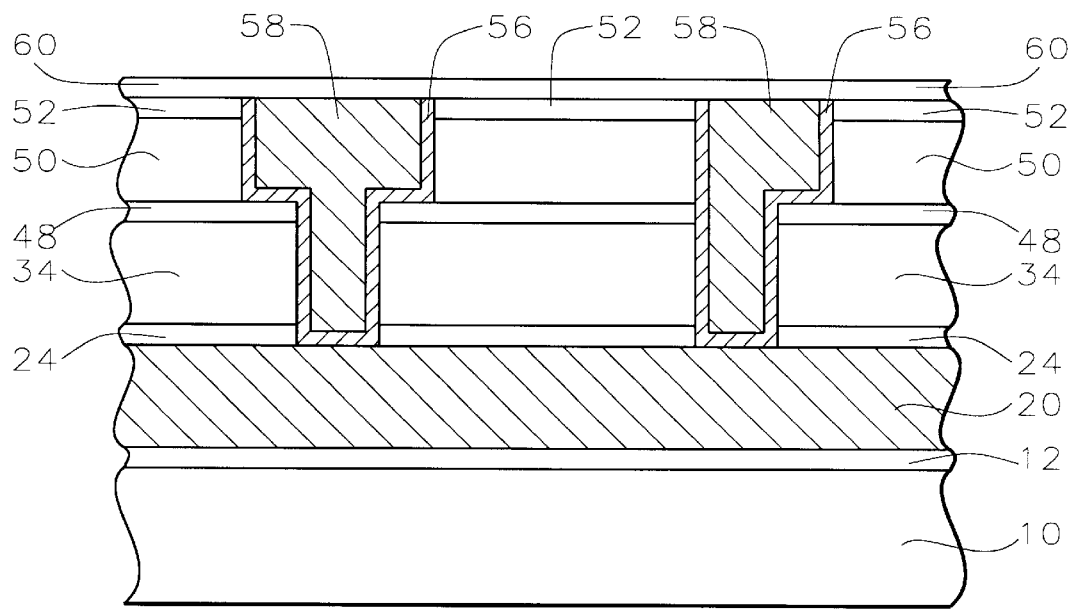
FIGS. 18 through 26 schematically illustrate in cross-sectional representation a third embodiment of the present invention.
Figure 19:
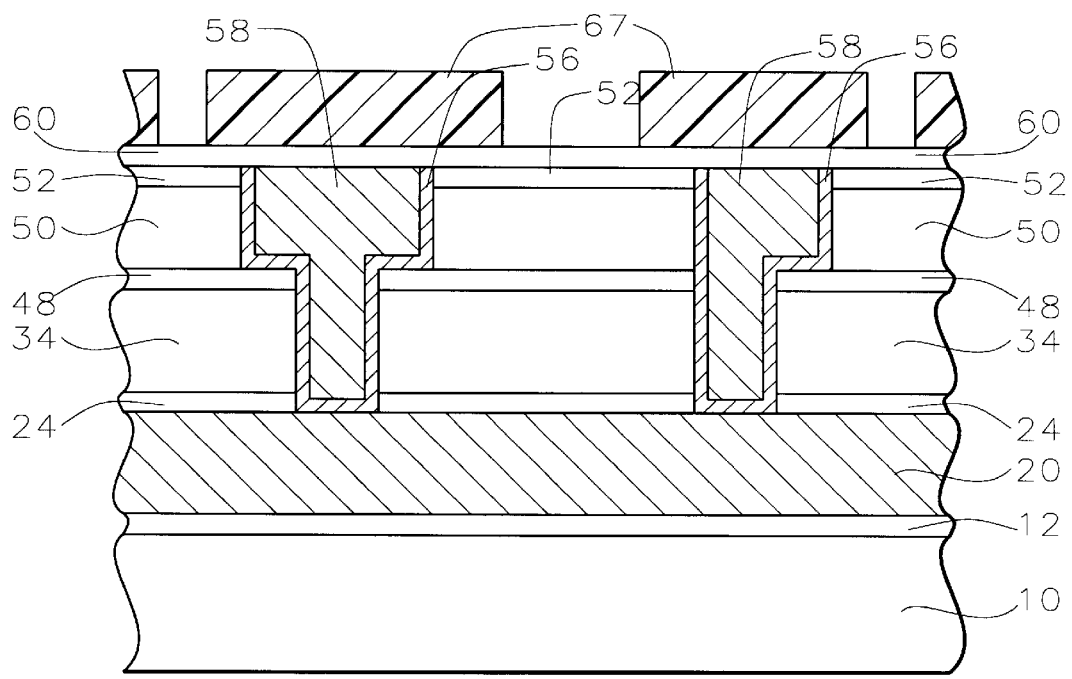

Both alternatives begin with FIG. 18 which illustrates a partially completed integrated circuit device. Dual damascene processing has been completed as is conventional in the art. Interconnection line 20 is shown overlying insulating or passivating layer 12 on a semiconductor substrate 10. Interconnection line 20 can comprise copper and barrier metal (e.g. tantalum, tantalum nitride) or a multilayer stack comprising one or more of the following: aluminum copper, tungsten, titanium, and titanium nitride. In the case of copper, the interconnection line may be part of a dual damascene interconnection, not shown. Semiconductor device structures, not shown, may be formed in and on the substrate and covered with the insulating or passivating layer 12. The interconnection conductor line 20 will contact at least one of the semiconductor device structures, not shown. Passivation layer 24 covers the interconnection line in the dual damascene interconnects. IMD layers 34 and 50, etch stop layer 48, and capping layer 52 are formed as is conventional. The capping layer 52 is optional in the first alternative, but required in the second alternative. Capping layer 52 comprises silicon nitride, silicon dioxide, silicon oxynitride, or others. Dual damascene openings are etched through the IMD1 and IMD2 layers 34 and 50, respectively, the etch stop layer 48 and the capping layer 52, using one of the various schemes such as trench-first, via-first, or embedded via. The dual damascene openings are then filled with a barrier metal layer 56 and a copper layer 57 by any of the conventional means, including physical or chemical vapor deposition and etchback or polishing, electroplating, or electroless plating, and so on. A final passivation layer 60, such as silicon nitride, completes the dual damascene interconnects. The first alternative of the third embodiment will be described with reference to FIGS. 19 through 22. In the first alternative, IMD1 and IMD2 comprise undoped silicon dioxide or doped silicon dioxide (e.g. FSG, PSG, BSG, or BPSG). After the dual damascene opening has been filled with copper and topped with passivation layer 60, a photoresist mask 67 is formed over the wafer having openings where dummy air plugs are to be formed, as shown in FIG. 19.

Figure 20:
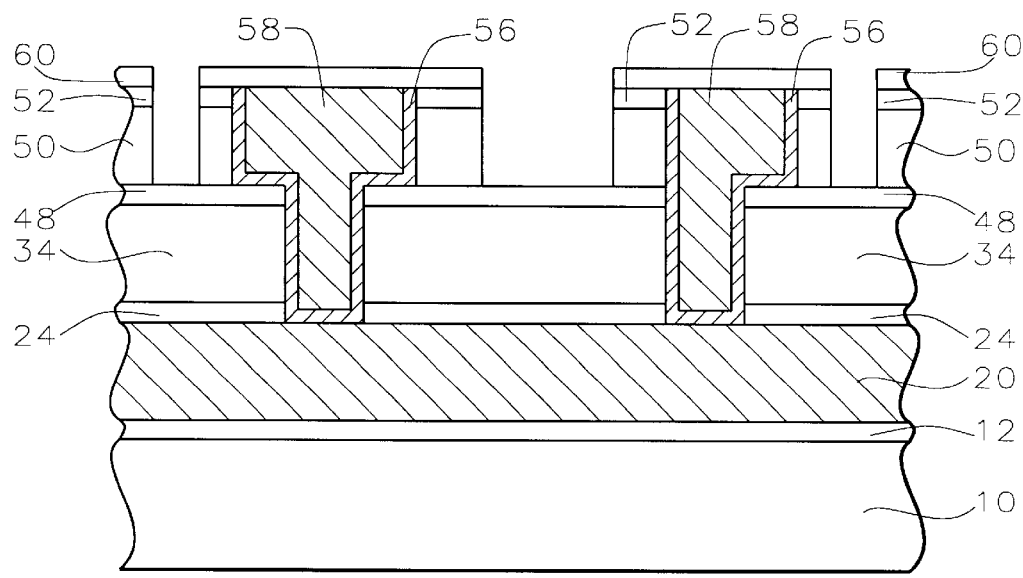

Referring now to FIG. 20, the passivation layer 60 is etched through where it is not covered by the photoresist mask, followed by the remaining optional capping layer 52, then the silicon dioxide layer not covered by the mask is etched through to the etch stop layer. The photoresist mask is stripped using oxygen plasma or chemical stripping.

Figure 21:
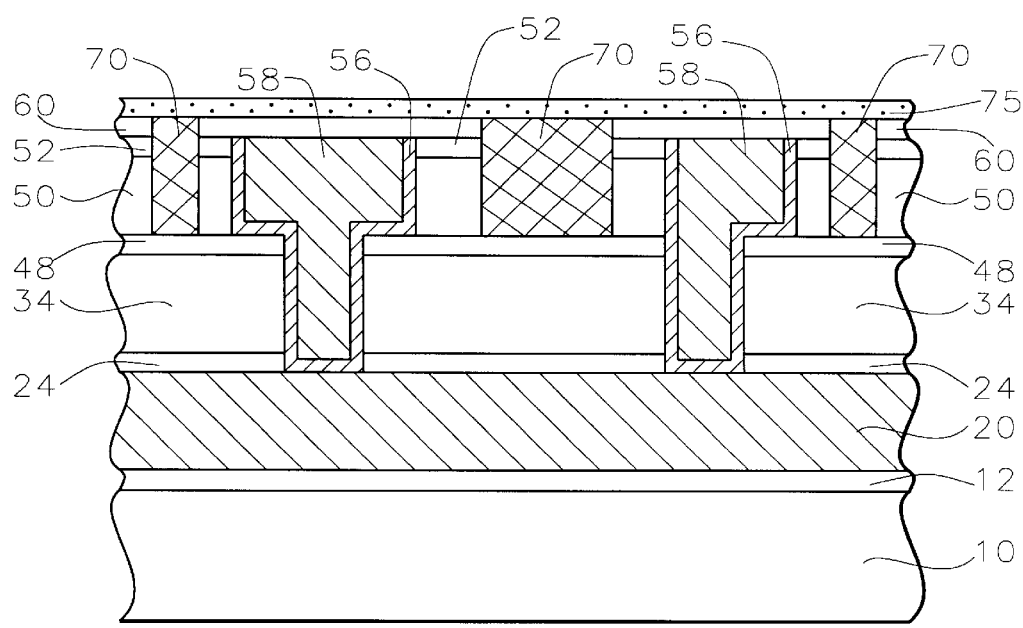

An organic material 70 is deposited within the spaces etched through the silicon dioxide layer, as shown in FIG. 21. Optionally, a liner layer, such as silicon oxide, not shown, may be deposited underlying the organic material 70. The liner layer functions as an adhesion promoter. The organic material may be photoresist, polyimide, poly(arylene)ether (e.g. FLARE from Allied Signal), Teflon, and others. Reflow of the organic material into the spaces may occur during the hot plate baking after spin coating at a temperature of between about 50 and 300° C. The organic material may then be subjected to an optional film densification treatment ("curing") in a furnace or RTA equipment at a temperature of between about 300 and 500° C. and pressure of between about 450 and 770 Torr. Optionally, the organic material is planarized by CMP or etching back, but preferably by etching back. The etching chemistry of the etching back comprises one or more of the following gases: nitrogen, hydrogen, forming gas (mixture of nitrogen and hydrogen), fluorine, chlorine, boron trichloride, oxygen, and argon.

Now the air bridge is to be formed. A thin layer of porous material 75 is deposited over the organic material 70 and passivation layer 60. The porous material is preferably a silicon material containing pores, such as amorphous silicon, porous silicon oxide, porous hydrogen silsesquioxane, porous alkyl silsesquioxane, or porous aryl silsesquioxane, deposited to a thickness of less than about 2000 Angstroms and preferably between about 50 and 1900 Angstroms.

Figure 22:
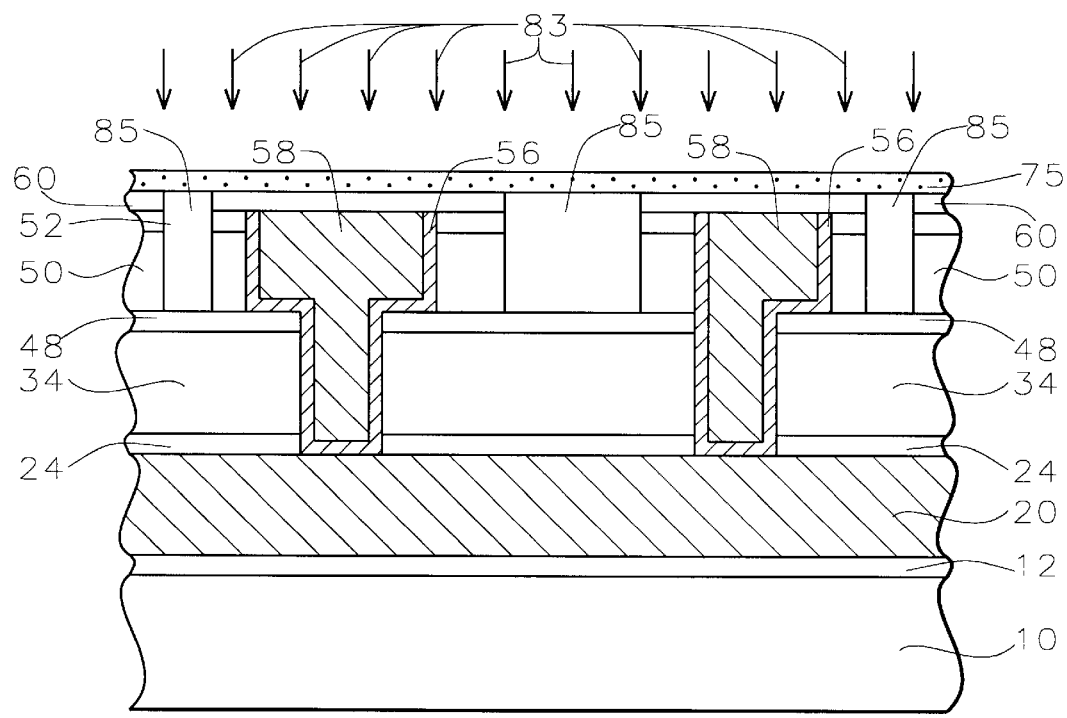

Now, the wafer is exposed to an oxygen plasma treatment 83. The oxygen species (e.g. radicals, molecules) from the plasma enters into the reactive material 70 through pores in the porous film 75. The oxygen species oxidizes the reactive material to form carbon dioxide and carbon monoxide among the products, thereby removing the reactive material 70 through the pores in the porous film and into the ambient, leaving air plugs 85, as shown in FIG. 22. Alternatively, ozone gas may be used in place of oxygen and the oxidation of the reactive material may be carried out with or without a plasma.

This completes the formation of dummy air plugs, reducing the RC delay by reducing the dielectric constant of the IMD layers.

The second alternative of the third embodiment will be described with reference to FIGS. 23 through 26. In the second alternative, IMD1 and IMD2 comprise a porous or non-porous organic material whose composition includes wholly carbon or a combination of carbon and one or more of the following elements: hydrogen, nitrogen, fluorine, chlorine, S, P, Br, I, and oxygen. Examples include: poly (arlene)ether (e.g.SILK from Dow Chemical, FLARE from Allied Signal), polyimide, and fluorinated polymer (e.g. Teflon).

Figure 23:
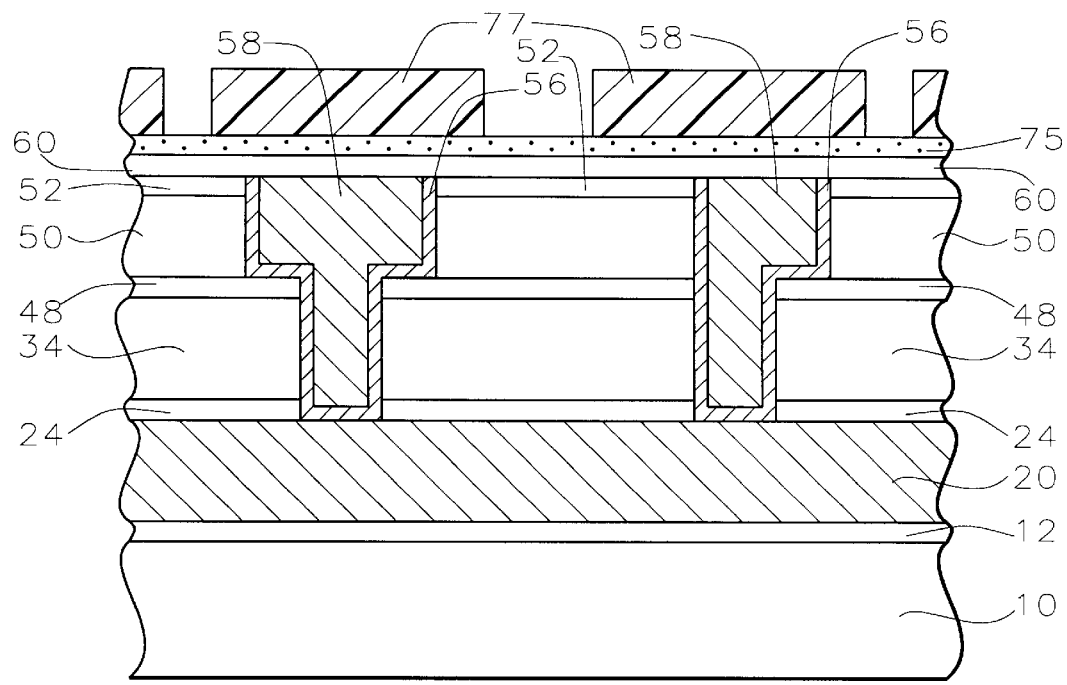

After the dual damascene openings have been filled with copper and topped with passivation layer 60 as shown in FIG. 18, the air bridge is formed. A thin layer of porous material 75 is deposited over the passivation layer 60, as shown in FIG. 23. The porous material is preferably a silicon material containing pores, such as amorphous silicon, porous silicon oxide, porous hydrogen silsesquioxane, porous alkyl silsesquioxane, or porous aryl silsesquioxane, deposited to a thickness of less than about 2000 Angstroms and preferably between about 50 and 1900 Angstroms. A photoresist mask 77 is formed over the wafer having openings where dummy air plugs are to be formed.

Figure 24:
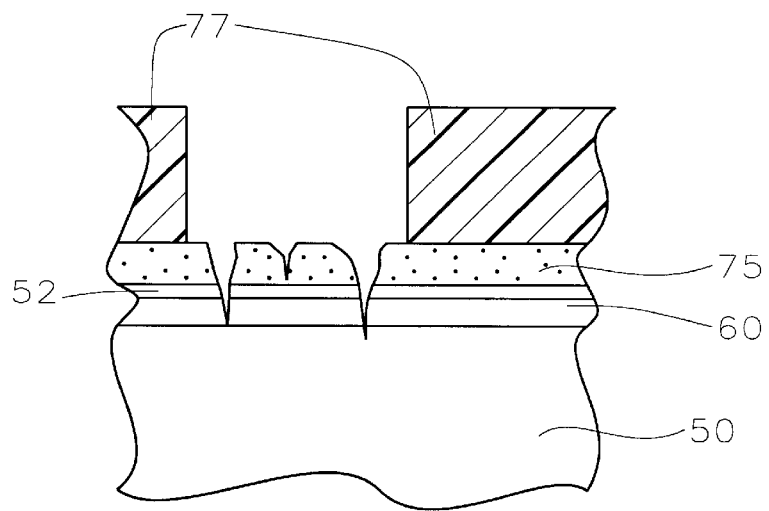

Now, an etching step is performed to enhance the cracks and pores of the porous layer 75 into the passivation layer 60 and capping layer 52. FIG. 24 is an enlarged view of the porous layer 75, the underlying passivation layer 60, capping layer 52, and a portion of the underlying organic material in IMD2 50, exposed by the photoresist mask 77. The etching step comprises plasma assisted etching wherein the etching chemistry comprises one or more of the following gases: chlorine, hydrogen bromide, fluorocarbon(s), fluorinated hydrocarbon(s), hydrocarbon(s), oxygen, nitrogen, hydrogen, argon, and helium. The etching may be accomplished in one or more steps. The air bridge 75 may be etched away by this etching step, but this is acceptable as long as the pores are perpetuated into and through the passivation layer 60.

Figure 25:
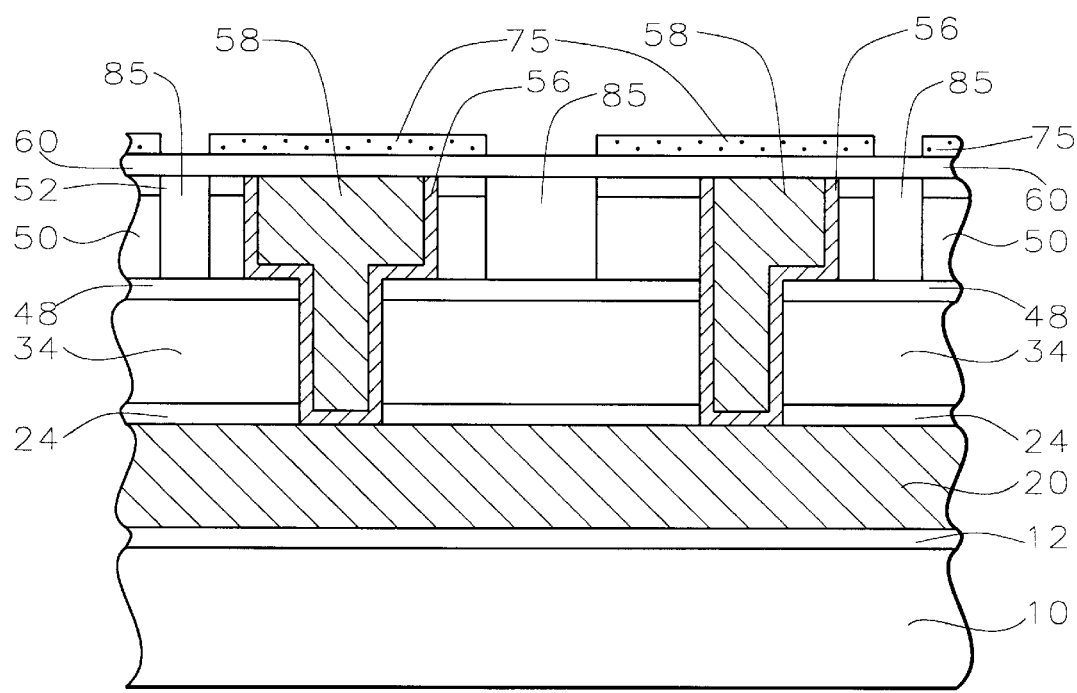
Figure 26:
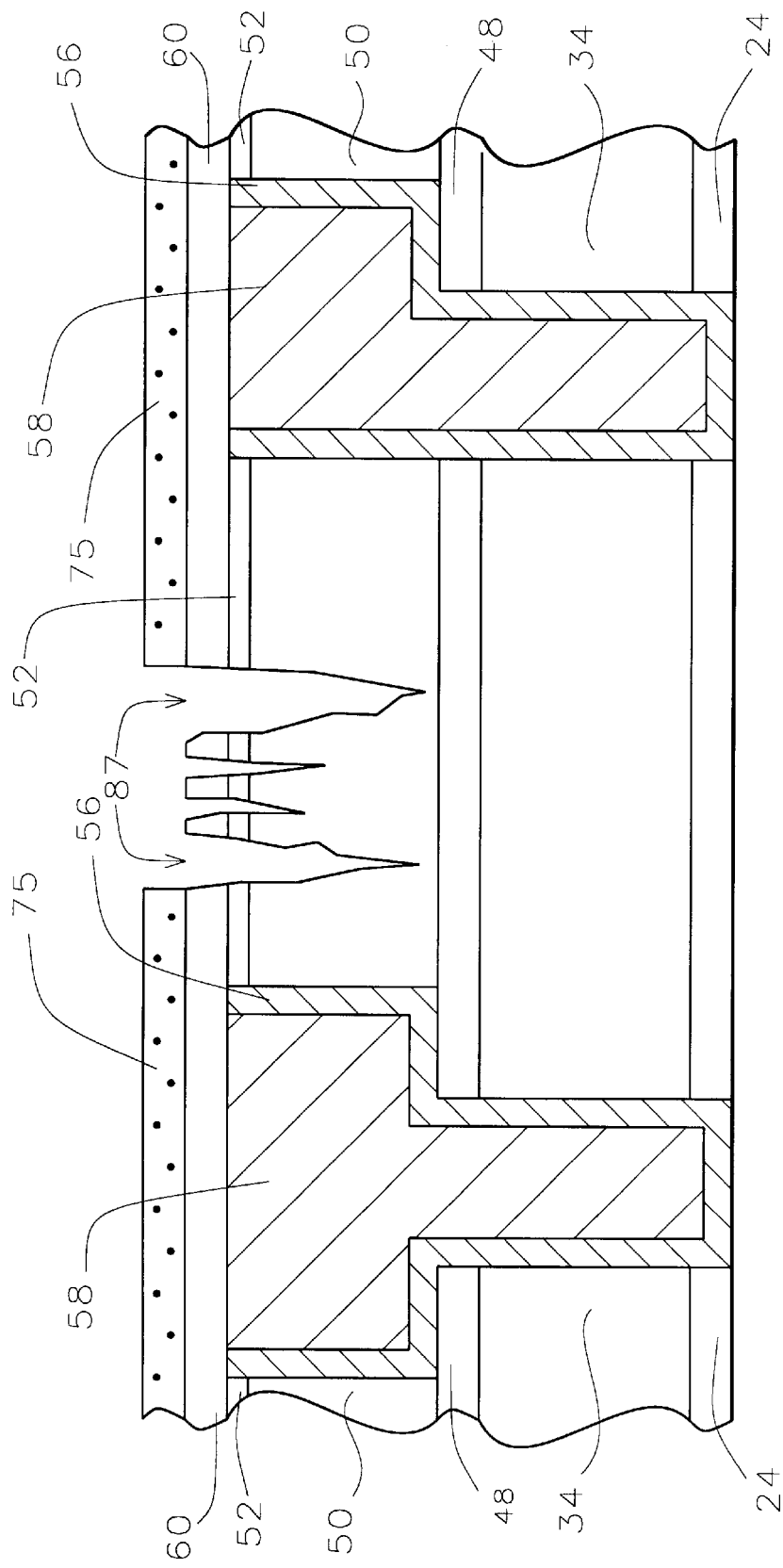

Now, the wafer is exposed to an oxygen plasma treatment. The oxygen species (e.g. radicals, molecules) from the plasma enters into the organic IMD material 50 through the enhanced pores in the passivation layer 60. The oxygen species oxidize the organic material 50, thereby removing it through the pores in the passivation layer and in the porous film and in to the ambient, leaving air plugs 85, as shown in FIG. 25. The oxygen plasma treatment simultaneously strips away the photoresist mask 77. Alternatively, ozone gas can be used in place of oxygen and the oxidation of the reactive material can be carried out with or without a plasma.

As an alternative to the oxygen plasma treatment, anisotropic etching of the organic material 50 can be achieved through the pores in the air bridge and passivation layer 60. The remaining photoresist can then be removed using oxygen plasma or a forming gas plasma or a mixture of oxygen and forming gas plasma. Wet chemical stripping can also be used. In this case, the dummy air plugs will be in the form of air pores 87, as shown in the enlarged view of FIG. 26.

This completes the formation of dummy air plugs 85 or dummy air pores 87, reducing the RC delay by reducing the dielectric constant of the IMD layers.

The process of the invention provides a method for reducing RC delay in integrated circuits by lowering the dielectric constant of the intermetal dielectric material between metal interconnects or metal damascene interconnects. The dielectric constant of the IMD is lowered by introducing air into the IMD between metal interconnections. An air bridge comprising a porous material, preferably amorphous silicon, porous silicon oxide, porous hydrogen silsesquioxane, porous alkyl silsesquioxane, and porous aryl silsesquioxane, is deposited over a layer containing a porous or non-porous reactive material. An oxygen plasma treatment or an anisotropic etching through the pores in the air bridge layer removes at least a portion of the reactive material, leaving air plugs within the IMD.

While the invention has been particularly shown and described with reference to the preferred embodiments thereof, it will be understood by those skilled in the art that various changes in form and details may be made without departing from the spirit and scope of the invention.

What is claimed is:

1. A method of forming air gaps between metal lines in the fabrication of integrated circuits comprising:

providing a plurality of metal lines over an insulating layer on a semiconductor substrate wherein there is a space between two of said metal lines;

depositing a reactive material over said metal lines and filling said space between said metal lines;

depositing a porous air bridge layer overlying said reactive material; and exposing said substrate to an oxygen plasma wherein said reactive material reacts with oxygen species in said oxygen plasma and is removed from said space between said metal lines through pores in said porous air bridge layer thereby forming said air gaps between said metal lines in the fabrication of integrated circuits.

2. The method according to claim 1 wherein said reactive material comprises an organic material containing carbon or a combination of carbon and one or more of the following elements: hydrogen, nitrogen, fluorine, chlorine, sulfur, phosphorus, bromine, iodine, and oxygen.

3. The method according to claim 1 wherein said porous air bridge layer comprises amorphous silicon having a thickness of less than about 2000 Angstroms.

4. The method according to claim 1 wherein said porous air bridge layer comprises porous silicon oxide having a thickness of less than about 2000 Angstroms.

5. The method according to claim 1 wherein said porous air bridge layer is selected from the group consisting of: porous hydrogen silsesquioxane, porous alkyl silsesquioxane, and porous aryl silsesquioxae and having a thickness of less than about 2000 Angstroms.

6. A method of forming air gaps between metal lines in the fabrication of integrated circuits comprising:

provided a plurality of metal lines over an insulating layer on a semiconductor substrate wherein there is a space between two of said metal lines;

depositing a silicon oxide liner layer overlying said metal lines and said insulating layer;

depositing a reactive material over said liner layer and filling said space between said metal lines;

depositing a porous air bridge layer overlying said reactive material; and exposing said substrate to an oxygen plasma wherein said reactive material reacts with oxygen species in said oxygen plasma and is removed from said space between said metal lines through pores in said porous air bridge thereby forming said air gaps between said metal lines in the fabrication of integrated circuits.

7. The method according to claim 6 wherein said reactive material comprises an organic material containing carbon or a combination of carbon and one or more of the following elements: hydrogen, nitrogen, fluorine, chlorine, sulfur, phosphorus, bromine, iodine, and oxygen.

8. The method according to claim 6 wherein said porous air bridge layer comprises amorphous silicon having a thickness of less than about 2000 Angstroms.

9. The method according to claim 6 wherein said porous air bridge layer is selected from the group consisting of: porous hydrogen silsesquioxane, porous alkyl silsesquioxane, and porous aryl silsesquioxane and has a thickness of less than about 2000 Angstroms.

10. A method of forming air gaps between metal lines in the fabrication of integrated circuits comprising:

providing a plurality of metal lines over an insulating layer on a semiconductor substrate wherein there is a space between two of said metal lines;

depositing a silicon oxide liner layer overlying said metal lines and said insulating layer;

depositing a reactive material over said liner layer and filling said space between said metal lines;

depositing a porous air bridge layer comprising amorphous silicon overlying said reactive material; and exposing said substrate to an oxygen plasma wherein said reactive material reacts with oxygen species in said oxygen plasma and is removed from said space between said metal lines through pores in said porous air bridge thereby forming said air gaps between said metal lines in the fabrication of integrated circuits.

11. The method according to claim 10 wherein said reactive material comprises an organic material containing carbon or a combination of carbon and one or more of the following elements: hydrogen, nitrogen, fluorine, chlorine, sulfur, phosphorus, bromine, iodine, and oxygen.

12. The method according to claim 10 wherein said porous air bridge layer has a thickness of less than about 2000 Angstroms.

13. A method of forming dummy air plugs between dual damascene interconnects in the fabrication of integrated circuits comprising:

providing a metal line overlying an insulating layer on a semiconductor substrate;

depositing a passivation layer overlying said metal line;

depositing a first intermetal dielectric layer overlying said passivation layer;

patterning said first intermetal dielectric layer to form spaces where planned said dummy air plugs will be formed;

depositing a reactive material within said spaces;

depositing a porous air bridge layer overlying said patterned first intermetal dielectric layer and said reactive material;

exposing said substrate to an oxygen plasma treatment wherein said reactive material reacts with oxygen species in said oxygen plasma and is removed from said spaces in said intermetal dielectric layer through pores in said air bridge layer thereby forming said dummy air plugs in said intermetal dielectric layer;

thereafter depositing a second intermetal dielectric layer over said air bridge layer;

patterning said intermetal dielectric layers to form a dual damascene opening; and filling said dual damascene opening with a metal layer to complete said dual damascene interconnects in the fabrication of integrated circuits.

14. The method according to claim 13 wherein said passivation layer comprises silicon nitride.

15. The method according to claim 13 wherein said first intermetal dielectric layer is selected from the group consisting of: undoped silicon dioxide, doped silicon, undoped silicate, and doped silicate.

16. The method according to claim 13 wherein said reactive material comprises an organic material containing carbon or a combination of carbon and one or more of the following elements: hydrogen, nitrogen, fluorine, chlorine, sulfur, phosphorus, bromine, iodine, and oxygen.

17. The method according to claim 13 further comprising depositing a liner layer underlying said reactive material wherein said liner layer acts as an adhesion promoter.

18. The method according to claim 13 wherein said porous air bridge layer is selected from the group consisting of: amorphous silicon, porous hydrogen silsesquioxane, porous alkyl silsesquioxane, and porous aryl silsesquioxane having a thickness of less than about 2000 Angstroms.

19. The method according to claim 13 further comprising depositing an etch stop layer overlying said porous air bridge layer.

20. The method according to claim 13 further comprising depositing a capping layer overlying said second intermetal dielectric layer.

21. The method according to claim 13 after said step of depositing said second intermetal dielectric layer and before said step of patterning said dual damascene opening, further comprising:

depositing an etch stop layer overlying said second intermetal dielectric layer;

depositing a third intermetal dielectric layer overlying said etch stop layer;

patterning said third intermetal dielectric layer to form spaces where a second set of planned said dummy air plugs will be formed;

depositing a reactive material within said spaces;

depositing a second porous air bridge layer overlying said patterned third intermetal dielectric layer and said reactive material;

exposing said substrate to a second oxygen plasma treatment wherein said reactive material reacts with oxygen species in said second oxygen plasma and is removed from said spaces in said third intermetal dielectric layer through pores in said second porous air bridge layer thereby forming said second set of dummy air plugs in said third intermetal dielectric layer; and thereafter depositing a fourth intermetal dielectric layer over said second air bridge layer.

22. The method according to claim 13 after said step of depositing said second intermetal dielectric layer and before said step of patterning said dual damascene opening, further comprising:

patterning said second intermetal dielectric layer to form spaces where a second set of planned said dummy air plugs will be formed wherein said second set of said dummy air plugs is not aligned with first said dummy air plugs;

depositing a reactive material within said spaces;

depositing a second porous air bridge layer overlying said patterned second intermetal dielectric layer and said reactive material;

exposing said substrate to a second oxygen plasma treatment wherein said reactive material reacts with oxygen species in said second oxygen plasma and is removed from said spaces in said second intermetal dielectric layer through pores in said second air bridge layer thereby forming said second set of dummy air plugs in said second intermetal dielectric layer;

depositing an etch stop layer overlying said second porous air bridge layer;

depositing a third intermetal dielectric layer overlying said second porous air bridge layer;

patterning said third intermetal dielectric layer to form spaces where a third set of planned said dummy air plugs will be formed wherein said third set of said dummy air plugs is aligned with first said dummy air plugs; depositing a reactive material within said spaces;

depositing a third porous air bridge layer overlying said patterned third intermetal dielectric layer and said reactive material;

exposing said substrate to a third oxygen plasma treatment wherein said reactive material reacts with oxygen species in said third oxygen plasma and is removed from said spaces in said third intermetal dielectric layer through pores in said third porous air bridge layer thereby forming said third set of dummy air plugs in said third intermetal dielectric layer; and thereafter depositing a fourth intermetal dielectric layer over said third porous air bridge layer.

23. A method of forming dummy air plugs between dual damascene interconnects in the fabrication of integrated circuits comprising:

providing dual damascene interconnects within a dielectric layer on a semiconductor substrate wherein said dielectric layer comprises at least an upper layer and a lower layer and wherein a passivation layer overlies said dual damascene interconnects;

patterning said passivation layer and said upper layer of said dielectric layer to leave openings where said dummy air plugs are to be formed;

depositing a reactive layer within said openings;

depositing a porous air bridge layer overlying said patterned passivation layer and said reactive layer; and thereafter exposing said substrate to an oxygen plasma treatment wherein said reactive material reacts with oxygen species in said oxygen plasma and is removed from said openings in said dielectric layer through pores in said porous air bridge layer thereby forming said dummy air plugs in said dielectric layer.

24. The method according to claim 23 wherein said dielectric layer is selected from the group consisting of: undoped silicon dioxide, doped silicon, undoped silicate, and doped silicate.

25. The method according to claim 23 wherein said dielectric layer further comprises a capping layer overlying said upper layer.

26. The method according to claim 25 wherein said capping layer is selected from the group consisting of: silicon nitride, silicon oxide, and silicon oxynitride.

27. The method according to claim 23 wherein said passivation layer comprises silicon nitride.

28. The method according to claim 23 wherein said reactive material comprises an organic material containing carbon or a combination of carbon and one or more of the following elements: hydrogen, nitrogen, fluorine, chlorine, sulfur, phosphorus, bromine, iodine, and oxygen.

29. The method according to claim 23 further comprising depositing a liner layer underlying said reactive material wherein said liner layer acts as an adhesion promoter.

30. The method according to claim 23 wherein said porous air bridge layer is selected from the group consisting of: amorphous silicon, porous hydrogen silsesquioxane, porous alkyl silsesquioxane, and porous aryl silsesquioxane having a thickness of less than about 2000 Angstroms.

31. A method of forming dummy air plugs between dual damascene interconnects in the fabrication of integrated circuits comprising:

providing dual damascene interconnects within a dielectric layer on a semiconductor substrate wherein said dielectric layer comprises an organic material, wherein a capping layer overlies said dielectric layer, and wherein a passivation layer overlies said dual damascene interconnects;

depositing a porous air bridge layer overlying said passivation layer;

forming a masking layer overlying said air bridge layer having openings where said dummy air plugs are to be formed;

etching said passivation layer and said capping layer not covered by said masking layer through pores in said air bridge layer to extend said pores into and through said passivation layer and said capping layer; and thereafter exposing said substrate to an oxygen plasma treatment wherein said organic material dielectric layer reacts with oxygen species in said oxygen plasma and is removed from said openings in said dielectric layer through said extended pores in said passivation layer and said capping layer and through pores in said porous air bridge layer thereby forming said dummy air plugs in said dielectric layer.

32. The method according to claim 31 wherein said capping layer is selected from the group consisting of: silicon nitride, silicon oxide, and silicon oxynitride.

33. The method according to claim 31 wherein said passivation layer comprises silicon nitride.

34. The method according to claim 26 wherein said porous air bridge layer is selected from the group consisting of: amorphous silicon, porous silicon oxide, porous hydrogen silsesquioxane, porous alkyl silsesquioxane, and porous aryl silsesquioxane having a thickness of less than about 2000 Angstroms.

35. A method of forming dummy air pores between dual damascene interconnects in the fabrication of integrated circuits comprising:

providing dual damascene interconnects within a dielectric layer on a semiconductor substrate wherein said dielectric layer comprises an organic material, wherein a capping layer overlies said dielectric layer, and wherein a passivation layer overlies said dual damascene interconnects;

depositing a porous air bridge layer overlying said passivation layer;

forming a masking layer overlying said porous air bridge layer having openings where said dummy air plugs are to be formed;

etching said passivation layer and said capping layer not covered by said masking layer through pores in said porous air bridge layer to extend said pores into and through said passivation layer and said capping layer; and thereafter anisotropically etching a portion of said dielectric layer through said pores in said porous air bridge layer and through said extended pores in said passivation and capping layers thereby forming said dummy air pores in said dielectric layer.

36. The method according to claim 35 wherein said passivation layer comprises silicon nitride.

37. The method according to claim 35 wherein said air bridge layer is selected from the group consisting of: amorphous silicon, porous silicon oxide, porous hydrogen silsesquioxane, porous alkyl silsesquioxane, and porous aryl silsesquioxane having a thickness of less than about 2000 Angstroms.

* * * * *